United States Patent
Mullen et al.

(10) Patent No.: US 7,626,474 B2
(45) Date of Patent: Dec. 1, 2009

(54) COMPENSATED ATTENUATOR CIRCUIT AND OSCILLOSCOPE UTILIZING THE SAME

(75) Inventors: Eric M. Mullen, Austin, TX (US); Mark Whittington, Austin, TX (US)

(73) Assignee: National Instruments Corporation, Austin, TX (US)

( * ) Notice: Subject to any disclaimer, the term of this patent is extended or adjusted under 35 U.S.C. 154(b) by 73 days.

(21) Appl. No.: 12/049,845

(22) Filed: Mar. 17, 2008

(65) Prior Publication Data

US 2009/0231069 A1 Sep. 17, 2009

(51) Int. Cl.
*H03H 7/24* (2006.01)
(52) U.S. Cl. .................................................. 333/81 R
(58) Field of Classification Search ............... 333/81 R, 333/17.2; 327/308, 309
See application file for complete search history.

(56) References Cited

U.S. PATENT DOCUMENTS

| 5,128,566 | A | 7/1992 | Killion et al. |
| 5,414,389 | A | 5/1995 | Watanabe et al. |
| 6,137,365 | A | 10/2000 | Wakairo et al. |
| 7,267,989 | B2 | 9/2007 | Shih et al. |
| 7,365,617 | B2 * | 4/2008 | Rostami et al. ........... 333/81 R |

* cited by examiner

*Primary Examiner*—Stephen E Jones
(74) *Attorney, Agent, or Firm*—Meyertons Hood Kivlin Kowert & Goetzel, P.C.; Jeffrey C. Hood; Erik A. Heter

(57) ABSTRACT

An attenuator circuit. The attenuator circuit includes a resistive divider coupled to a capacitive network including first and second capacitive dividers. The resistive divider is configured to perform an N:1 attenuation of a signal in a low frequency range. The first and second capacitive dividers are configured to perform an N:1 attenuation in the high frequency range that is a product of the attenuation provided by each (e.g., each performing an M:1 attenuation, where N=M×M, with the total attenuation of the capacitive dividers being N:1 where N=M×M). A variable capacitance divider is coupled in parallel with the second capacitive divider, and includes first and second variable capacitors that, when adjusted, change the high frequency attenuation of the attenuator circuit to match the value of the high frequency attenuation to that of the low frequency attenuation.

20 Claims, 4 Drawing Sheets

COMPENSATED ATTENUATOR CIRCUIT AND OSCILLOSCOPE UTILIZING THE SAME

FIELD OF THE INVENTION

This invention relates to electronic circuits, and more particularly, to attenuation circuits.

DESCRIPTION OF THE RELATED ART

Attenuation circuits are well known in the art of electronic circuits. Such attenuation circuits may be used in systems wherein there is a need to decrease the magnitude of an input signal to within a desired range. For example, attenuation circuits are commonly used in oscilloscopes to decrease the magnitude of large amplitude signals to within a linear range of an input buffer amplifier.

FIG. 1 is a schematic of one common type of attenuation circuit that may be implemented in an oscilloscope input. The attenuation circuit shown is a 100:1 attenuation circuit, as it is configured to scale down an input signal by a factor of 100 in order that it be within the linear range of an input buffer to which it is coupled. The circuit includes a resistive divider coupled in parallel with a capacitive divider. The resistive divider is used to attenuate low frequency signals, while the capacitive divider is used to attenuate high frequency signals. Ideally, the low frequency attenuation of the circuit will match the high frequency attenuation of the circuit. Alternatively, such a circuit can be viewed as ideal if the RC time constant of the upper leg of the circuit matches the RC time constant of the lower leg of the circuit. From an attenuation perspective, if the attenuation values do not match, errors (e.g., settling tails on the order of microseconds) may be introduced into the signal by the oscilloscope (this is also true if the RC time constants do not match). Such errors may be considered unacceptable for a precision measuring instrument.

In the embodiment shown in FIG. 1, R1, R2, and C1 are strictly passive components. C2 may be a combination of a passive capacitor in parallel with a parasitic capacitance introduced by a printed circuit board (PCB) upon which the circuit is implemented, as well as that of the input buffer amplifier. The embodiment shown further includes an extra capacitance, C3, which is a tunable capacitor. The value of C3 is centered around a nominal value (20 pF in this particular example), and is used to compensate out the high frequency attenuation variability introduced by parasitic capacitances of the PCB and tolerance errors that may be present in the other passive components. In order to effectively compensate out the high frequency attenuation variability, C3 must have a sufficient tuning range.

Variable capacitors that can achieve the capacitance swings required by C3 are available in various forms, such as manual trim capacitors or varactor diodes. Each of these two options has its own unique disadvantages. The manual trim capacitors need to be adjusted in the manufacturing process by a human operator which increases manufacturing cost and time, while the varactor diodes require additional support circuitry which increases power consumption and requires additional space on a PCB.

SUMMARY OF THE INVENTION

An attenuator circuit is disclosed. In one embodiment the attenuator circuit includes a resistive divider coupled to an input node and an output node and a capacitive network including first and second capacitive dividers arranged in a cascaded configuration. The resistive network is configured to perform an N:1 attenuation of the low frequency portion of a signal received on the input node and provide the signal on the output node. The capacitive network includes the first capacitive divider coupled to the input node and being configured to perform a first attenuation (e.g., at a factor of M:1) of a high frequency portion of the signal received on the input node. The capacitive network further includes the second capacitive divider circuit coupled to receive the signal from the first capacitive divider and configured to perform a second attenuation (e.g., also at a factor of M:1) of the high frequency portion of the signal and provide the signal on the output node. The total attenuation of the high frequency portion of the signal is N:1, (e.g., where N=M×M). A variable capacitance divider is coupled in parallel with the second capacitive divider. The variable capacitance divider includes first and second variable capacitors that, when adjusted, change the high frequency attenuation of the circuit.

In one embodiment, the first and second variable capacitors are trim capacitors. The trim capacitors may be programmable trim capacitors that are controllable by software. The first variable capacitor is configured to adjust the high frequency attenuation over a first range of attenuation values, while the second variable capacitor is configured to adjust the high frequency attenuation over a second range of attenuation values. The first range is larger than the second range. Thus, the first trim capacitor may be used for coarse tuning of the high frequency attenuation, whereas the second trim capacitor may be used for fine tuning of the high frequency attenuation.

An oscilloscope is also disclosed. The oscilloscope includes a probe and an attenuator circuit coupled to the probe. The oscilloscope also includes an attenuator circuit having a resistive divider coupled to an input node and an output node and a capacitive network including first and second capacitive dividers arranged in a cascaded configuration. The resistive divider is configured to perform an N:1 attenuation of a low frequency portion of a signal received on the input node. The capacitive network including the first capacitive divider is coupled to the input node and is configured to perform a first attenuation of a high frequency portion of the signal received on the input node. The capacitive network further includes the second capacitive divider circuit coupled to receive the signal from the first capacitive divider and is configured to perform a second attenuation of the high frequency portion of the signal and provide the signal on the output node. The total attenuation of the high frequency portion of the signal is N:1. A variable capacitance divider is coupled in parallel with the second capacitive divider. The variable capacitance divider includes first and second variable capacitors that, when adjusted, change the high frequency attenuation of the circuit. The oscilloscope further includes a vertical amplifier coupled to receive the attenuated signal from the attenuator circuit, and a display coupled to the vertical amplifier. The display is configured to display a graphic representation of the signal.

An electronic circuit that provides N:1 signal attenuation is also contemplated. The electronic circuit includes first means for attenuating a low frequency portion of a signal by a factor of N:1, second means for attenuating a high frequency portion of the signal, and third means for attenuating the high frequency portion of the signal, for a total high frequency signal attenuation of N:1. The circuit further includes fourth means for adjusting the high frequency attenuation of said second and third means.

BRIEF DESCRIPTION OF THE DRAWINGS

Other aspects of the invention will become apparent upon reading the following detailed description and upon reference to the accompanying drawings in which.

Figure 1:
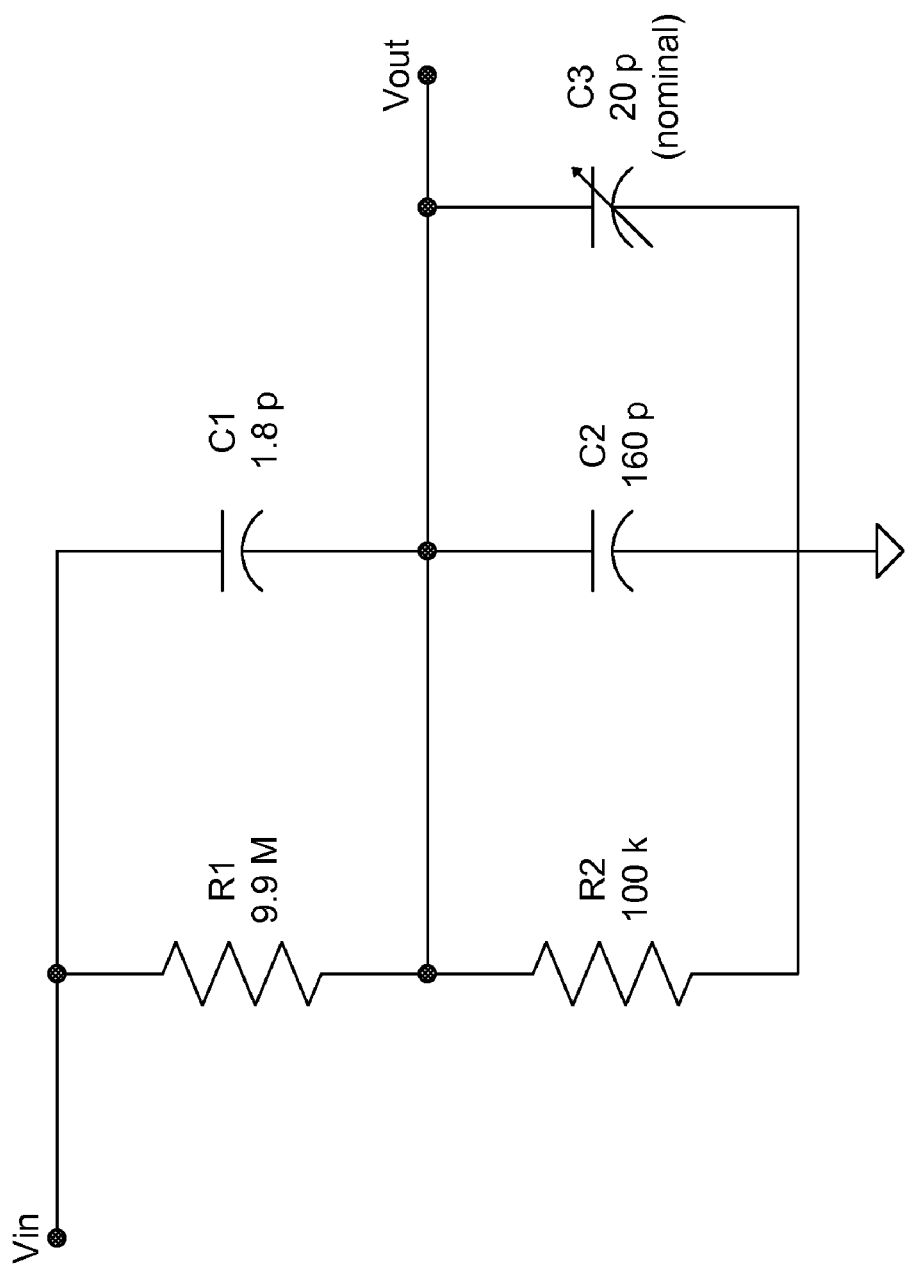
FIG. 1 is a schematic diagram of an attenuation circuit according to the prior art.

While the invention is susceptible to various modifications and alternative forms, specific embodiments thereof are shown by way of example in the drawings and will herein be described in detail. It should be understood, however, that the drawings and description thereto are not intended to limit the invention to the particular form disclosed, but, on the contrary, the invention is to cover all modifications, equivalents, and alternatives falling within the spirit and scope of the present invention as defined by the appended claims.

DETAILED DESCRIPTION OF THE INVENTION

Figure 2:
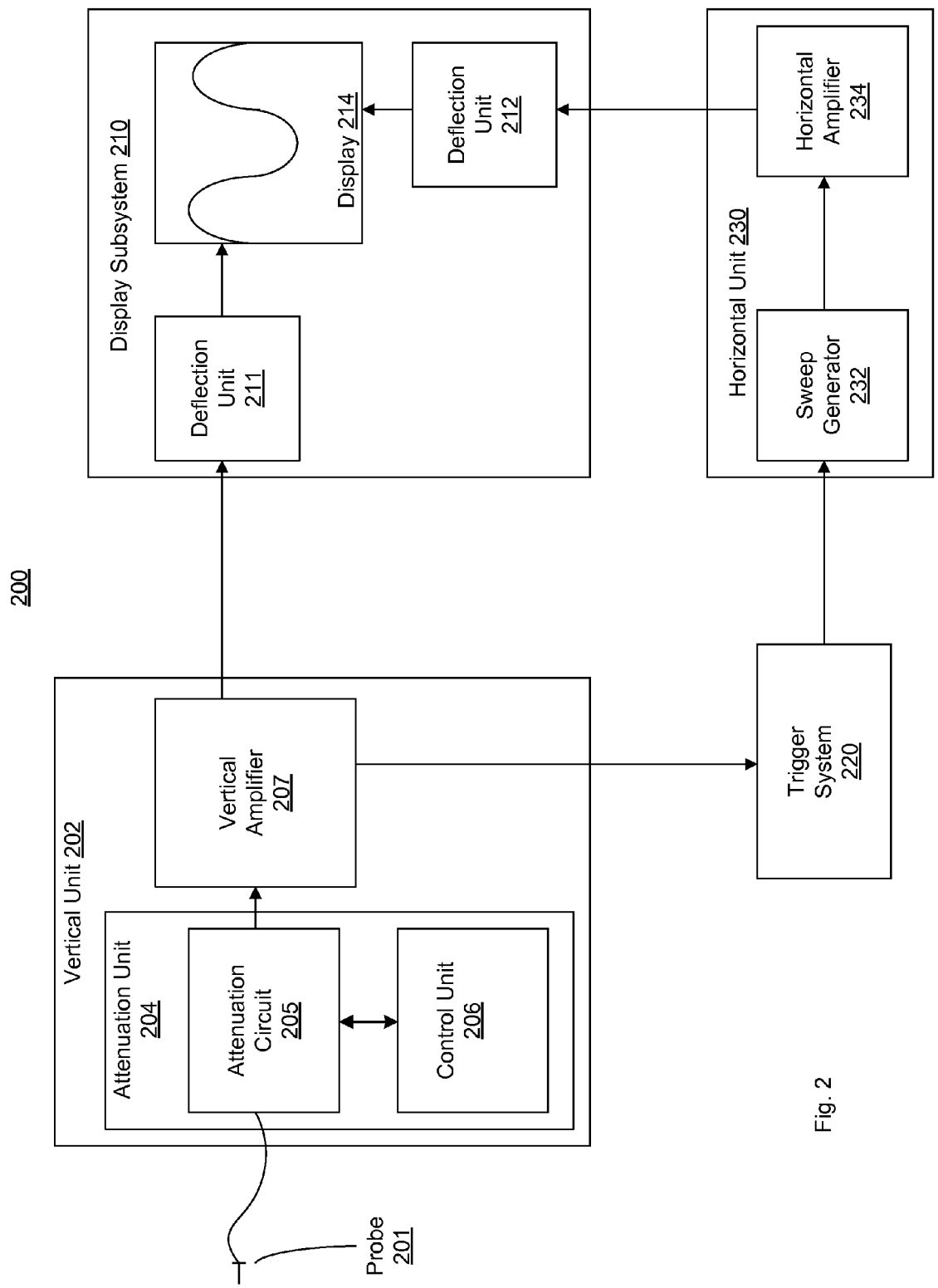
FIG. 2 is a block diagram of one embodiment of an oscilloscope.

Turning now to FIG. 2, a block diagram of one embodiment of an oscilloscope is shown. In the embodiment shown, oscilloscope 200 includes a probe 201, vertical unit 202, a horizontal unit 230, a trigger system 220, and a display subsystem 210. It should be noted that the embodiment shown here is an exemplary embodiment of an analog oscilloscope, and is but one of many possible embodiments contemplated. Digital oscilloscopes, as well as a wide variety of different oscilloscope types (e.g., dual beam oscilloscopes, mixed-signal oscilloscopes) are also possible and contemplated within the scope of this disclosure.

Probe 201 may be coupled to a suitable point on an electrical/electronic circuit in order to measure a signal. The signal is conveyed through probe 201 to attenuation circuit 205 of attenuation unit 204. The attenuation circuit 205 (which will be discussed in further detail below) attenuates the signal voltage to a range suitable for use in vertical amplifier 207. The amplified signal is then conveyed from vertical amplifier to both deflection unit 211 and trigger system 220.

A horizontal sweep is initiated (i.e. 'triggered') by trigger system 220. Responsive to the triggering of a horizontal sweep, sweep generator 232 generates a sweep by causing a dot on the display to be swept across display 214 within a specific time interval. For example, the sweep generator may cause the dot to be swept across display 214 500,000 times per second. The actual sweep rate may be determined by an operator input. An output signal from sweep generator 232 is received and amplified by horizontal amplifier 234. The amplified signal is then conveyed to deflection unit 212.

The vertical deflection from deflection amplifier 211 and the horizontal sweeping action received via deflection unit 212 are combined in display 214 to form a graphical representation of the signal being measured. In this particular embodiment, a sample sine wave is illustrated as being displayed on display 214.

Vertical unit 202 includes an attenuation unit 204. Attenuation unit 204 includes an attenuation circuit 205 and a control unit 206. In the embodiment shown, attenuation unit 205 utilizes trim capacitors that can be controlled by control unit 206. While attenuation circuits utilizing manually controlled trim capacitors are possible and contemplated herein, the embodiment shown in FIG. 2 utilizes programmable trim capacitors. Control unit 206 is configured to interface with the programmable trim capacitors of attenuation circuit 205 in order to automatically control their respective capacitance values. More particularly, control unit 206 is configured to execute software instructions that adjust the capacitance values in order to control the high frequency attenuation of the attenuator. Controlling the high frequency attenuation may be performed with the objective of matching the high frequency attenuation of the circuit to the low frequency attenuation of the circuit. Matching these two attenuation values may minimize or eliminate errors introduced by oscilloscope 200 in the signal that is being measured by oscilloscope 200. The attenuation circuit 205 will be explained in further detail below with reference to FIG. 3.

The low frequency attenuation is performed in a first range of frequencies that extends from D.C, or 0 Hz, up to a transition frequency. In various embodiments, the transition frequency can be considered to be a frequency in which the capacitive network of the circuit begins to dominate the attenuation profile. In the circuit of FIG. 1, the transition frequency can be calculated as $1/(2*pi*R*C)$. The high frequency attenuation is performed in a second range of frequencies wherein the lowest frequency thereof is greater than the transition frequency. For example, the first range of frequencies may extend from 0 Hz up to and including a transition frequency of 10 kHz, wherein the second range of frequencies may extend from just above the transition frequency of 10 kHz to infinity. The transition frequency may vary with the particular application, and may be greater or lesser than the 10 kHz exemplary value used here. In general, the lowest frequency of the second range is greater than the highest frequency of the first range. The first range of frequencies bounded on the lower end by 0 Hz and on the upper end by the transition frequency. The second range of frequencies has no upper bound, and has a lower bound that is greater than the transition frequency, even if the difference between these two is infinitesimally small, and therefore negligible.

Figure 3:
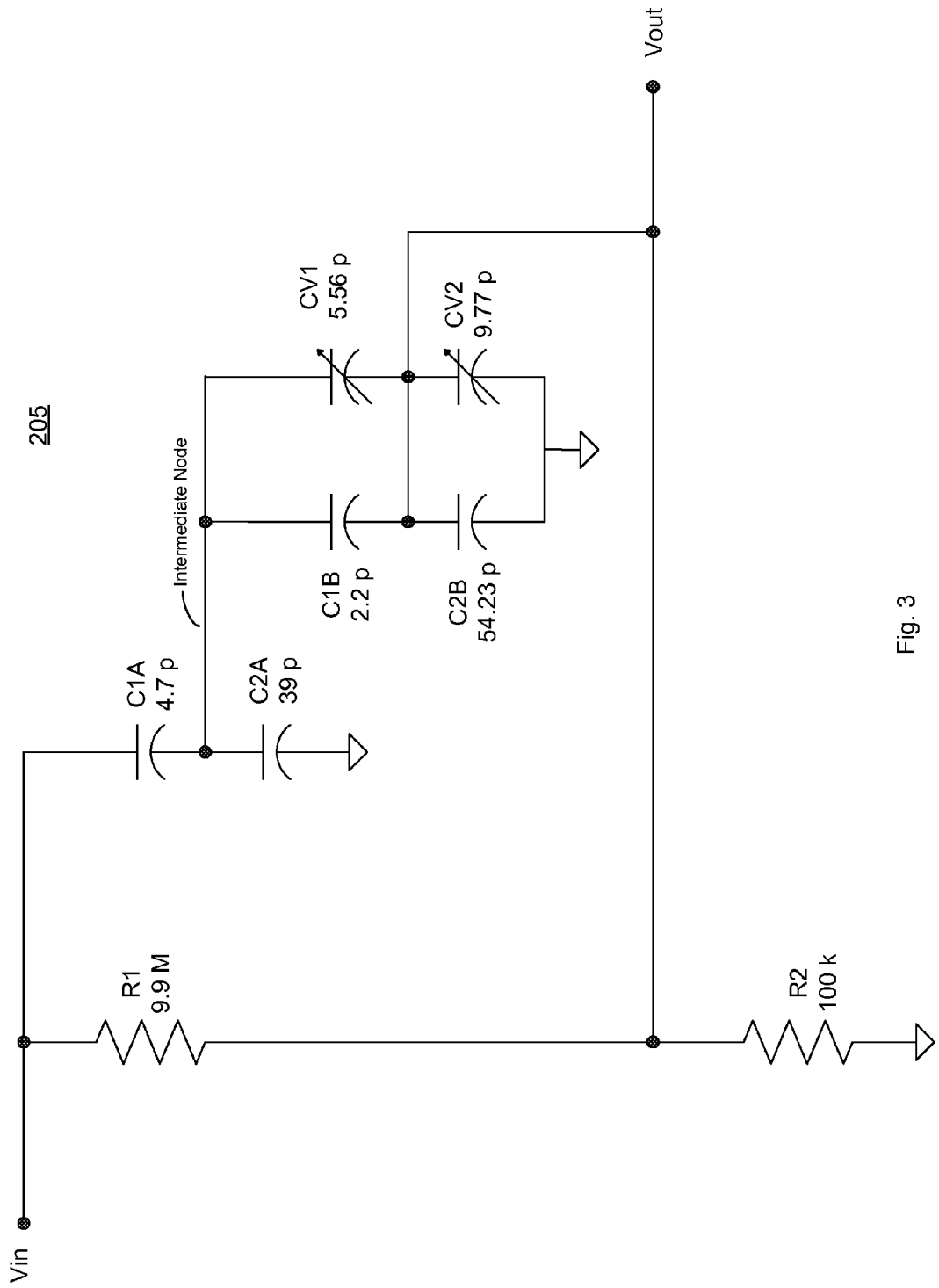
FIG. 3 is a schematic diagram of one embodiment of an attenuation circuit used in the oscilloscope of FIG. 2.

FIG. 3 is a schematic diagram of one embodiment of an attenuation circuit used in the oscilloscope of FIG. 2. It should be noted that while attenuation circuit 205 is particularly useful in oscilloscope 200, it may also be used in other applications as well. In general, attenuation circuit 205 may be useful in any application where signal attenuation with little to no error induction is required.

It should be noted that while specific rated component values are shown as associated with the various components of attenuation circuit 205, these values are exemplary. The actual values used for each of these components may vary widely and in accordance with the specific requirements of the circuit and its application.

In the embodiment shown, attenuation circuit 205 includes a resistive divider circuit, two capacitive divider circuits, and a variable capacitance divider circuit. The resistive divider comprising R1 and R2 is configured to provide attenuation of DC and low frequency signal components of a signal received on the input node. The resistive divider circuit includes resistors R1 and R2. Resistor R1 is coupled between an input node (Vin) and an output node (Vout). Resistor R2 is coupled between the output node and a ground node. In this particular implementation, attenuation circuit 205 is configured to provide approximately a 100:1 attenuation of the DC and low frequency components of the signal (i.e. those signal components in the first range of frequencies as described above).

Resistor R1 has a nominal value of 9.9 mega ohms, while resistor R2 has a nominal value of 100 kilo ohms. Thus, the ratio of the two resistance values provides a close approximation of a 100:1 ratio. In general, the ratio of the resistance values is N:1, and is chosen to approximately match the attenuation ratio of the circuit, also N:1. In many embodiments, (e.g., 10:1, 100:1, etc.) the resistance value of R1 will be at least one order of magnitude greater than the resistance value of R2.

A first capacitive divider circuit includes fixed value capacitors C1A and C2A. In this particular embodiment, the first capacitive divider circuit is configured to attenuate high frequency components (i.e. within the second range of frequencies, as described above) of a signal received on the input node at a ratio of approximately 10:1. Generally speaking, the first capacitive divider may be configured to attenuate the high frequency components of the signal at a ratio of M:1. The signal attenuated by the first capacitive divider circuit is conveyed on an intermediate node which is defined by the junction where C1A is coupled to C2A.

A second capacitive divider includes fixed value capacitors C1B and C2B. The second capacitive divider is coupled to the first capacitive divider in a cascaded configuration. The signal attenuated in the high frequency range at (approximately) a 10:1 ratio (or more generally M:1) by the first capacitive divider is received by the second capacitive divider via the intermediate node, which is coupled to C1B. The signal is then further attenuated at (approximately) a 10:1 ratio (generally, M:1) and conveyed to the output node. Thus, the two cascaded capacitive dividers provide a total attenuation of approximately 100:1.

In general, the attenuation circuit shown in FIG. 3 attenuates signals at a ratio of N:1, with high frequency attenuation provided by each of the capacitive dividers at a ratio of approximately M:1 for each, where N=M×M, while low frequency attenuation is provided by the resistive divider at a ratio of N:1. Although the embodiment shown is a 100:1 attenuation circuit, embodiments that attenuate signals according to other ratios are possible (e.g., a 25:1, or N=25 attenuation circuit with two cascaded capacitive dividers that each provide attenuation at a ratio of 5:1, or M=5). Embodiments are further contemplated wherein the capacitive dividers provide attenuation at differing ratios (e.g., a 100:1 attenuation circuit with a first capacitive divider attenuating at a ratio of 20:1 and a second capacitive divider attenuating at a ratio of 5:1, or more generally, N=M×K, where M=20 and K=5 in this example). In general, any ratio desired could be selected for the value of N. The same applies individually to each of the attenuation ratios of the first and second capacitive stages, which need not be the same as each other. It should also be noted that these ratios are approximations, and may vary slightly, although overall circuit function is the same.

A variable capacitive divider circuit, including variable capacitors CV1 and CV2, is coupled in parallel with the second capacitive divider circuit. The variable capacitors CV1 and CV2 are used to perform an adjustment of the high frequency attenuation of attenuator circuit 202 by variation of their respective capacitances. In the embodiment shown, adjusting the respective capacitances of CV1 and CV2 is performed in order to adjust the high frequency attenuation of the second M:1 capacitive divider to achieve a total capacitive (and high frequency) attenuation equal to N:1, which should match the low frequency N:1 attenuation provided by the resistive divider. Matching the high frequency attenuation to the low frequency attenuation as closely together as possible is performed in order to minimize or eliminate errors that would otherwise be induced into the signal received on the input node.

In the configuration shown, CV1 is used for coarse tuning of the second M:1 attenuation network while CV2 is used for fine tuning of the second M:1 attenuation network. The range of values over which the high frequency attenuation is varied according to capacitance variations of CV1 is larger than the range of values over which the high frequency attenuation is varied in accordance with a capacitance variation of CV2. Thus, a small change of the capacitance of CV1 may result in a significant change to the high frequency attenuation, while a similar change to the capacitance of CV2 may result in a much smaller change in the high frequency attenuation. Therefore, the capacitance of CV1 may be varied to place the high frequency attenuation in the vicinity of that of the low frequency attenuation (coarse tuning). The capacitance of CV2 may then be varied to bring the high frequency attenuation of the circuit as close as possible to that of the low frequency attenuation of the circuit (fine tuning).

An alternative view the circuit of FIG. 3 is based on RC time constants instead of attenuation values. In the configuration shown, CV1 is used for coarse tuning of the RC time constant while CV2 is used for fine-tuning of an RC time constant of the circuit. The range of values over which the RC time constant is varied according to capacitance variations of CV1 is larger than the range of values over which the RC time constant is varied in accordance with a capacitance variation of CV2. Thus, a small change of the capacitance of CV1 may result in a significant change to the RC time constant, while a similar change to the capacitance of CV2 may result in a much smaller change in the RC time constant. Therefore, the capacitance of CV1 may be varied to place the RC time constant of the upper circuit portion in the vicinity of that of the lower circuit portion (coarse tuning). The capacitance of CV2 may then be varied to bring the RC time constant of the lower circuit portion as close as possible to that of the upper circuit portion (fine tuning). In order to better understand the circuit configuration comprising the upper half and lower half, the parallel capacitances can be added together (e.g., C1B and C1V, C2B and C2V), followed by a Wye-to-Delta transformation on the circuit. This results in a circuit that includes resistor R1 in parallel with a first capacitor coupled between the input node and the output node (the upper portion), and R2 in parallel with a second capacitor coupled between the output node and the ground node (the lower portion. A third capacitor coupled between the input node and the ground node is also present, although it can be ignored for the purposes of adjusting the time constant of the circuit.

In various embodiments, attenuation circuit 205 may be implemented using discrete components, an integrated circuit, or various combinations thereof. For example, the variable capacitors of the circuit may comprise a package that integrates a plurality of selectable capacitances, which may be selected in various combinations in order to vary the capacitance, and thus, the high frequency attenuation. One such embodiment of a variable capacitor will now be discussed in reference to FIG. 4.

Figure 4:
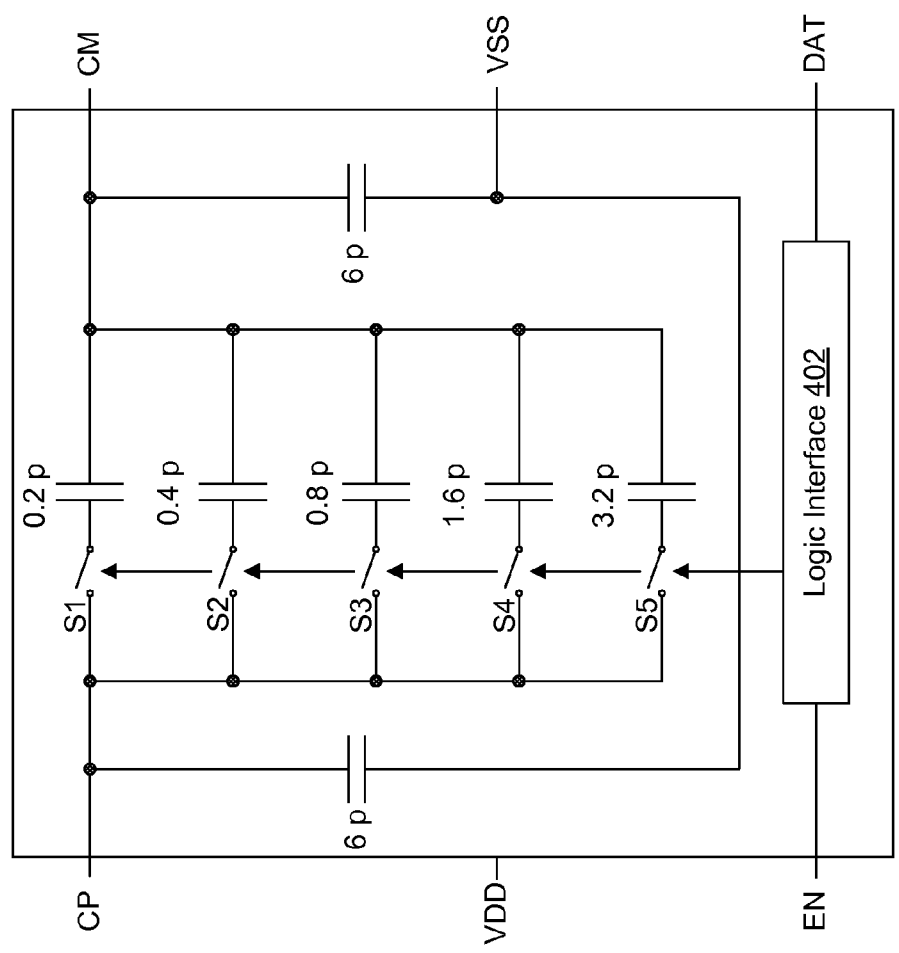
FIG. 4 is a schematic diagram of one embodiment of a programmable trim capacitor that may be used in the attenuation circuit of FIG. 3.

FIG. 4 is a schematic diagram of one embodiment of a programmable trim capacitor that may be used in the attenuation circuit of FIG. 3. More particularly, FIG. 4 is a schematic of a MAX1474 by Maxim Integrated Products, Inc., that may be used in some embodiments of attenuation circuit 205. It should be noted however, this is but one design choice for the variable capacitor that may be used, and other variable capacitors, by the same manufacturer or different manufacturers, may also be used. In general, the variable capacitor chosen for the attenuation circuit may be any one that is suitable for the particular embodiment.

The initial high frequency M:1 attenuation provided by C1A and C2A in FIG. 3 may protect the internal circuitry of CV1 (MAX1474). Typical digitally programmable capacitors cannot withstand the high voltages that would be developed across CV1 without using the cascaded arrangement as shown in FIG. 3. Thus, providing a first capacitive divider utilizing fixed value capacitors C1A and C2A enables the implementation of a variable capacitance divider that includes CV1 and CV2.

The first M:1 attenuation provided by the first capacitive divider also decreases the range of attenuation values over which the high frequency attenuation is varied according to a capacitance variation of CV1. Thus, while CV1 provides a coarse attenuation adjustment in the second (high) frequency range, the amount of variation it provides to accurately match the attenuation of the second capacitive divider to that of the first is reduced due to the presence of the first capacitive divider. In addition to reducing the amount of attenuation variation provided by CV1, the presence of the first capacitive divider further enhances the ability of CV2 to provide fine attenuation adjustments, since a variable capacitor with a smaller overall capacitance range but a much finer step size between adjacent capacitance values can be used. Therefore, providing a first M:1 attenuation and reducing the voltage swings which must be withstood by variable capacitors CV1 and CV2 may enable accurate matching of the attenuation provided by the first capacitive divider to that provided by the second capacitive divider while using relatively inexpensive variable capacitors.

In the embodiment shown, variable capacitor 400 includes two 6 pF (picofarad) capacitances coupled between the CP and CM pins. Variable capacitor 400 also includes an arrangement of several capacitances coupled in series with corresponding switches S1-S5. Closing a switch for a corresponding capacitance places it in parallel with any other capacitances existing between the CP and CM pins of the device. Thus, the capacitance provided by variable capacitor 400 may be varied according to the particular combination of switches that are opened and closed.

The capacitances shown in this embodiment of variable capacitor 400 are arranged in a binary weighted configuration, with the lowest value being 0.2 pF, the next value being 0.4 pF, the next value being 0.8 pF, and so forth. Variable capacitors using other weightings, including those were all capacitances have approximately the same value, may also be used in various embodiments of the attenuation circuit.

The programmed capacitance value of variable capacitor 400 at any given time is the capacitance value existing between the CP and CM pins. The CP pin is intended for coupling to a high impedance node, while the CM pin is intended for coupling to a low impedance node. Thus, implementing variable capacitor 400 as CV1 in the embodiment of FIG. 3 would entail coupling the CP pin to the intermediate node and coupling the CM pin to the output node, Vout. Implementing another instance of variable capacitor 400 as CV2 in the embodiment of FIG. 3 would entail coupling the CP pin to the output node, and the CM pin to the ground node.

Variable capacitor 400 in the embodiment shown is a trim capacitor, and more particularly, a digitally programmable trim capacitor. Thus, variable capacitor 400 may be useful in an attenuation unit such as that shown in FIG. 2, and may be controllable by a control unit. Programming a particular capacitance value (and thus, varying the capacitance value) may be performed by asserting an enable signal on the EN input and providing a plurality of pulses to the DAT input.

After asserting the enable signal, a counter in logic interface 402 counts the number of pulses received on the DAT input until the enable signal is de-asserted. In this particular embodiment, the number of pulses counted may be any value between 0 and 31 pulses. After the enable signal is de-asserted, the counter value is latched to control registers in logic interface 402. Based on the value in the control registers, logic interface 402 may then open or close various ones of switches S1-S5 in order to set the capacitance to the desired value, as indicated by the number of pulses counted.

Because of its programmability, the embodiment shown (and similar embodiments) of variable capacitor 400 may be particularly useful in the attenuation unit 204 of FIG. 2. Using variable capacitors 400 in an attenuation circuit 205 (of FIG. 3) in the attenuation unit 204 may result in an embodiment wherein the high frequency attenuation can be set and re-adjusted as necessary by control unit 206. During initialization or calibration of oscilloscope 200, control unit 206 may set the capacitance values of the variable capacitors 400 in attenuation circuit 205 in order to match as closely as possible the high frequency attenuation of the circuit to the low frequency attenuation of the circuit. If an adjustment to the high frequency attenuation is necessary during operation or upon a subsequent calibration, control unit 206 may repeat the programming operation to set the variable capacitor(s) to a new value. In some embodiments, control unit 206 may be able to automatically re-adjust the capacitance value(s) with no operator intervention.

Utilization of the circuit configuration shown in FIG. 3 may allow for the use of various components (resistors, capacitors) with wide tolerances as opposed to attenuation circuits that require components with tight tolerances. Thus, components with a tolerance of +/−5% may be used in lieu of components with a tolerance of +/−1%, and so forth. This may reduce the cost of the attenuation circuit, as components with tighter tolerances are typically more expensive than those with looser tolerances.

While embodiments utilizing manually set trim capacitors are possible and contemplated, the utilization of programmable trim capacitors in the attenuation circuit may allow for adjustment of the capacitances (and thus the high frequency attenuation) under automatic control. This may eliminate the need for the labor costs associated with manual adjustment of the variable capacitors. Since programmable trim capacitors such as that discussed in reference to FIG. 4 are relatively low power devices, impact on the total power budget of the circuits in which they are implemented may be minimal or even negligible.

While the present invention has been described with reference to particular embodiments, it will be understood that the embodiments are illustrative and that the invention scope is not so limited. Any variations, modifications, additions, and improvements to the embodiments described are possible. These variations, modifications, additions, and improvements may fall within the scope of the inventions as detailed within the following claims.

The invention claimed is:

1. An attenuation circuit comprising:
    a resistive divider coupled to an input node and an output node, wherein the resistive divider is configured to provide N:1 attenuation in a first range of frequencies of a signal received via the input node, the first range of frequencies extending from 0 up to a transition frequency;
    a capacitive network including first and second capacitive dividers arranged in a cascaded configuration, wherein:

the first capacitive divider is coupled to the input node and being configured to perform a first attenuation in a second range of frequencies of the signal; and the second capacitive divider is coupled to receive the signal from the first capacitive divider and configured to perform a second attenuation in the second range of frequencies of the signal and provide the signal on the output node, wherein frequencies of the second range of frequencies are greater than the transition frequency, and wherein the total attenuation performed in the second range of frequencies is N:1; and a variable capacitance divider coupled in parallel with the second capacitive divider, the variable capacitance divider including first and second variable capacitors that, when adjusted, change an amount of attenuation provided in the second range of frequencies by the first and second capacitive dividers.

2. The attenuation circuit as recited in claim 1, wherein each of the first and second variable capacitors is a trim capacitor.

3. The attenuation circuit as recited in claim 1, wherein each of the first and second variable capacitors is a programmable trim capacitor that is controllable by software.

4. The attenuation circuit as recited in claim 1, wherein the first variable capacitor is configured to adjust the attenuation over a first range of attenuation values and the second variable capacitor is configured to adjust the attenuation over a second range of attenuation values, wherein the first range is larger than the second range.

5. The attenuation circuit as recited in claim 1, wherein the first attenuation is performed by a factor of M:1, wherein the second attenuation is performed by a factor of M:1, wherein the attenuation circuit is configured to attenuate the signal by a factor of N:1, wherein N=M×M.

6. The attenuation circuit as recited in claim 5, wherein N=100 and M=10.

7. The attenuation circuit as recited in claim 1 wherein the attenuation circuit includes:
a first resistor and a second resistor coupled to form the first resistor divider;
a first fixed value capacitor and a second fixed value capacitor coupled to form the first capacitive divider; and
a third fixed value capacitor and a fourth fixed value capacitor coupled to form the second capacitive divider.

8. The attenuation circuit as recited in claim 7 wherein:
the first resistor is coupled between the input node and the output node, and wherein the second resistor is coupled between the output node and a ground node;
the first fixed value capacitor is coupled between the input node and an intermediate node and the second fixed value capacitor is coupled between the intermediate node and the ground node; and
the third fixed value capacitor is coupled between the intermediate node and the output node and the fourth fixed value capacitor is coupled between the output node and the ground node.

9. The attenuation circuit as recited in claim 8, wherein the first variable capacitor is coupled between the intermediate node and the output node, and wherein the second variable capacitor is coupled between the output node and the ground node.

10. The attenuation circuit as recited in claim 8, wherein a resistance value of the first resistor is at least one order of magnitude greater than a resistance value of the second resistor.

11. An oscilloscope comprising:
a probe;
an attenuator circuit coupled to receive a signal via the probe, wherein the attenuator circuit includes:
a resistive divider coupled to an input node and an output node, wherein the resistive divider is configured to provide N:1 attenuation in a first range of frequencies of the signal, the first range of frequencies extending from 0 up to a transition frequency;
a capacitive network including first and second capacitive dividers arranged in a cascaded configuration, wherein:
the first capacitive divider is coupled to the input node and being configured to perform a first attenuation in a second range of frequencies of the signal; and
the second capacitive divider is coupled to receive the signal from the first capacitive divider and configured to perform a second attenuation in the second range of frequencies of the signal and provide the signal on the output node, wherein frequencies of the second range of frequencies are greater than the transition frequency, and wherein the total attenuation performed in the second range of frequencies is N:1; and
a variable capacitance divider coupled in parallel with the second capacitive divider, the variable capacitance divider including first and second variable capacitors that, when adjusted, change an amount of attenuation provided in the second range of frequencies by the first and second capacitive dividers
a vertical amplifier coupled to receive the signal from the attenuation circuit; and a display coupled to the vertical amplifier and a horizontal amplifier, wherein the display is configured to display a graphic representation of the signal.

12. The oscilloscope as recited in claim 11, wherein:
the first resistor is coupled between the input node and the output node, and wherein the second resistor is coupled between the output node and a ground node;
the first fixed value capacitor is coupled between the input node and an intermediate node and the second fixed value capacitor is coupled between the intermediate node and the ground node; and
the third fixed value capacitor is coupled between the intermediate node and the output node and the fourth fixed value capacitor is coupled between the output node and the ground node.

13. The oscilloscope as recited in claim 11, wherein each of the first and second variable capacitors is a trim capacitor.

14. The oscilloscope as recited in claim 13, wherein each of the first and second variable capacitors is a programmable trim capacitor that is controllable by software.

15. The oscilloscope as recited in claim 14, wherein the oscilloscope further includes a control unit coupled to each of the first and second variable capacitors, wherein the control unit is configured to automatically adjust capacitances of each of the first and second variable capacitors in order to control the amount of attenuation provided in the second range of frequencies.

16. The oscilloscope as recited in claim 15, wherein the first variable capacitor is configured to adjust the attenuation over a first range of attenuation values and the second variable capacitor is configured to adjust the attenuation over a second range of attenuation values, wherein the first range is larger than the second range.

17. The oscilloscope as recited in claim 16, wherein the attenuation circuit includes:
- a first resistor and a second resistor coupled to form the first resistor divider;
- a first fixed value capacitor and a second fixed value capacitor coupled to form the first capacitive divider; and
- a third fixed value capacitor and a fourth fixed value capacitor coupled to form the second capacitive divider.

18. An electronic circuit comprising:
- first means for providing N:1 attenuation in a first range of frequencies of a signal, wherein the first range of frequencies extends from 0 up to a transition frequency;
- second means for attenuating the signal in a second range of frequencies, said second means being coupled to said first means;
- third means for additionally attenuating the signal in the second range of frequencies for a total signal attenuation of N:1 in the second range, said third means being coupled to said second means, wherein frequencies of the second range of frequencies are greater than the transition frequency; and
- fourth means for adjusting attenuation of said second and third means, said fourth means being coupled to said third means.

19. The electronic circuit as recited in claim 18, wherein said fourth means includes first and second variable capacitors and control means for adjusting capacitances of each of the first and second variable capacitors.

20. The electronic circuit as recited in claim 19, wherein said attenuating performed by said second means is performed at a factor of M:1, said attenuating performed by said third means is at a factor of M:1, and wherein the total attenuation in the second range is N:1, wherein N=M×M.

* * * * *